United States Patent
Chen

(10) Patent No.: US 7,852,664 B2
(45) Date of Patent: Dec. 14, 2010

(54) MAGNETIC MEMORY CELL STRUCTURE WITH THERMAL ASSISTANT AND MAGNETIC DYNAMIC RANDOM ACCESS MEMORY

(75) Inventor: Wei-Chuan Chen, Taipei County (TW)

(73) Assignee: Industrial Technology Research Institute, Hsinchu (TW)

( * ) Notice: Subject to any disclaimer, the term of this patent is extended or adjusted under 35 U.S.C. 154(b) by 317 days.

(21) Appl. No.: 12/189,781

(22) Filed: Aug. 11, 2008

(65) Prior Publication Data

US 2009/0147567 A1   Jun. 11, 2009

(30) Foreign Application Priority Data

Dec. 10, 2007   (TW) .............................. 96147027 A

(51) Int. Cl.
*G11C 11/00*   (2006.01)
(52) U.S. Cl. .................. 365/158; 365/171; 365/173
(58) Field of Classification Search ................. 365/158, 365/171, 173; 257/427
See application file for complete search history.

(56) References Cited

U.S. PATENT DOCUMENTS

| | | | |
|---|---|---|---|
| 6,385,082 B1 | 5/2002 | Abraham et al. | |
| 6,538,919 B1 | 3/2003 | Abraham et al. | |
| 6,545,906 B1 | 4/2003 | Savtchenko et al. | |
| 6,654,279 B2 * | 11/2003 | Nishimura | 365/173 |
| 6,667,897 B1 | 12/2003 | Abraham et al. | |
| 6,980,468 B1 * | 12/2005 | Ounadjela | 365/171 |
| 2005/0281081 A1 | 12/2005 | Fullerton et al. | |
| 2007/0189064 A1 * | 8/2007 | Min et al. | 365/158 |

\* cited by examiner

*Primary Examiner*—Son Dinh
(74) *Attorney, Agent, or Firm*—Jianq Chyun IP Office

(57) ABSTRACT

A magnetic memory cell structure with thermal assistant includes a magnetic pinned layer, a barrier layer, a magnetic free layer, a perpendicular magnetic layer, and a heating layer sequentially stacked. The magnetic free layer has a longitudinal magnetization. The perpendicular magnetic layer has a perpendicular magnetization at a first temperature and is perpendicularly coupling to the longitudinal magnetization of the magnetic free layer. The perpendicular magnetic layer is in a paramagnetic state at a second temperature. The present invention further includes magnetic dynamic random access memory.

26 Claims, 6 Drawing Sheets

MAGNETIC MEMORY CELL STRUCTURE WITH THERMAL ASSISTANT AND MAGNETIC DYNAMIC RANDOM ACCESS MEMORY

CROSS-REFERENCE TO RELATED APPLICATION

This application claims the priority benefit of Taiwan application serial no. 96147027, filed on Dec. 10, 2007. The entirety of the above-mentioned patent application is hereby incorporated by reference herein and made a part of this specification.

BACKGROUND OF THE INVENTION

1. Field of the Invention

The present invention generally relates to a memory cell structure, and in particularly, to a magnetic memory cell structure with thermal assistant.

2. Description of Related Art

Magnetic random access memory (MRAM) has the advantages of non-volatility, high density, high read/write speed, radiation resistance, and so on. When writing data, usually, two current lines (for example, a write bit line (WBL) and a write word line (WWL) are used to sense the cells selected from the intersections of magnetic fields, and the magnetoresistance value of the magnetic cell is changed by changing the magnetization direction of the magnetic material of the memory layer. When reading the memory data, a sense amplifier provides a current to the selected magnetic memory cells, and reads the magnetoresistance value of the magnetic cells to determine the digital value of the memory data.

The magnetic memory cell is a multi-layered magnetic metal material having a stacked structure, including a soft magnetic layer, a tunnel barrier layer, a hard magnetic layer, and a nonmagnetic conductor. The memory "1" or "0" state is determined by the parallel or antiparallel magnetization direction of the magnetic material at two sides of the tunnel barrier layer.

FIG. 1 shows a basic structure of a magnetic memory cell. Referring to FIG. 1, in order to access a magnetic memory cell, current lines 100, 102, also referred to as, for example, a bit line and a word line according to an operation manner thereof are intersected and applied with proper currents. When the two lines are applied with currents, magnetic fields in two directions are generated, so as to obtain a magnetic field with desired magnitude and direction to be applied on a magnetic memory cell 104. The magnetic memory cell 104 has a stacked structure, including a magnetic pinned layer, having a fixed magnetization or a total magnetic moment in a predetermined direction. Various magnetoresistances are generated by using the difference between angles formed between magnetizations of the magnetic free layer and the magnetic pinned layer, for reading data. Further, in order to write data, a write magnetic field is applied to determine the magnetization of the magnetic free layer without the magnetic field. The data stored in the memory cell may be read by output electrodes 106, 108. The operation details of the magnetic memory are known to those of ordinary skill in the art and will not be described herein.

FIG. 2 shows a memory mechanism of a magnetic memory. In FIG. 2, a magnetic pinned layer 104a has a fixed magnetization moment direction 107. A magnetic free layer 104c is located above the magnetic pinned layer 104a and is isolated from the magnetic pinned layer 104a by a tunnel barrier layer 104b. The magnetic free layer 104c has a magnetization moment direction 108a or 108b. If the magnetization moment direction 107 is parallel to the magnetization moment direction 108a, the generated magnetoresistance represents, for example, data of "0". If the magnetization moment direction 107 is anti-parallel to the magnetization moment direction 108b, the generated magnetoresistance represents, for example, data of "1".

The magnetic free layer 104c in FIG. 2 has a single-layered structure, and easily generates data error in operation. U.S. Pat. No. 6,545,906 discloses a free layer having a ferromagnetic/non-magnetic metal/ferromagnetic tri-layered structure instead of the single-layered ferromagnetic material in conjunction with a toggle operation mode to reduce the interference of the adjacent cells when writing data. The free layer has a synthetic antiferreomagnet structure, and the top and the bottom magnetic layer each has a magnetization. FIG. 3 shows a structure of a conventional synthetic antiferromagnetic free layer. As shown in FIG. 3, magnetic metal layers 150, 154 disposed on and below a nonmagnetic metal layer 152, are arranged in an antiparallel manner to form closed magnetic lines of force. A magnetic pinned layer 168 beneath is separated from a magnetic free layer 166 by a tunnel barrier layer (T) 156. The magnetic pinned stacked layer 168 includes a top pinned layer (TP) 158, a nonmagnetic metal layer 160, and a bottom pinned layer (BP) 162. The top pinned layer and the bottom pinned layer have a fixed magnetization. Furthermore, an antiferromagnetic layer 164 is included.

For the magnetic free layer 166 having a tri-layered structure, the bit line BL and the write word line WWL are set at an angle of 45 degrees with respect to the magnetic anisotropic axis of the magnetic free layer 166, the magnetic anisotropic axis direction is the so-called easy axis direction. In this manner, the bit line BL and the write word line WWL may apply a magnetic field at an angle of 45 degrees with respect to the easy axis on the magnetic free layer 166 in sequence, to rotate the magnetization of the magnetic free layer 166. The toggle operation mode can effectively eliminate the interference.

However, since advanced processes are continuously adopted in CMOS technology and the design of high-density MRAM is employed, the magnetic tunnel junction (MTJ) interface of the core elements of MRAM is continuously reduced. As for the toggle MTJ elements, the switching field of the free layer will be continuously increased when the size is reduced. At the same time, due to the demagnetization field effect, the magnetization arrangement at the edges of the free layer is not uniform and cannot be controlled, and thus the initial state of the MTJ switching is inconsistent, resulting in non-uniform switching field. Further, the volume is decreased, and the energy barrier (KuV, where Ku is the magnetic anisotropy constant, and V is the magnetic film volume) stored in the free layer is decreased accordingly. When the energy barrier is decreased about to the same level of the thermal energy (kT), the magnetization direction of the free layer in the MTJ will be switched due to the disturbance of the external thermal energy, causing the loss of the stored data in the application of memory.

In order to improve the thermal stability at small size, another technique of a magnetic memory unit with thermal assistant using magnetic field switching has been developed, capable of further reducing the size of the elements. FIGS. 4A to 4C show a schematic view of a memory cell using a thermal assistant mechanism to apply a magnetic field bias. Referring to FIG. 4A, a magnetic free layer 170 on a tunnel barrier layer 156 has a magnetization marked by arrows. Further, an antiferromagnetic layer 172 is formed on the magnetic free layer 170, and a part of the magnetization of the antiferromagnetic layer 172 has an exchange coupling force with the magnetization of the magnetic free layer 170. Since the antiferromagnetic layer 172 is in an antiferromagnetic state at room temperature, the antiferromagnetic layer 172 has a strong coupling force with the magnetization of the magnetic free layer 170. Referring to FIG. 4B, when the antiferromagnetic layer 172 is above the Neel temperature, it becomes a paramagnetic state; and the interactive coupling function with the magnetic free layer 170 disappears. Referring to FIG. 4C, the magnetization of the magnetic free layer 170 is easily switched, thus recording as "0", "1." When the temperature is decreased to the room temperature, the characteristics of the antiferromagnetic layer 172 appears again, and the magnetization of the magnetic free layer 170 is fixed.

FIG. 5A is a schematic view of an operating circuit. A magnetic memory cell 180 in FIGS. 4A to 4C is coupled to the words line (WL) and the bit line (BL). The word line controls a switch transistor 181 to be connected to a ground voltage. For example, the antiferromagnetic layer 172 is changed to be paramagnetic by conducting a current $I_{heat}$ to the word line. And then, a magnetic field for changing the magnetization of the magnetic free layer 170 is generated by conducting a current $I_{field}$ to the bit line. Thereafter, the supply of the current $I_{heat}$ stops, and the temperature returns to the room temperature. FIG. 5B is a schematic view illustrating a relationship between an exchange magnetic bias strength and a temperature. Referring to FIG. 5B, due to the exchange magnetic bias generated by the interactive coupling force, the switching field required by the free layer for switching must be up to 180 Oe, thus the thermal stability is greatly improved. Accordingly, when writing, as long as the temperature is raised to 150° C. or above, the field required for switching is lower than 20 Oe.

Although the prior art can achieve the stability of temperature, the material for providing the exchange field is a horizontal antiferromagnetic material, so the miniaturization of the dimension is limited.

Accordingly, another memory cell structure is provided in the prior art. FIG. 6 shows a structure of another conventional memory cell with thermal assistant. Referring to FIG. 6(a) of FIG. 6, the magnetization of a magnetic pinned layer 182 is perpendicular to the horizontal direction through the formulation of the ingredients of the magnetic material. A perpendicular magnetic free layer 186 is isolated from the magnetic pinned layer 182 by a barrier layer 184, and the magnetization of the perpendicular magnetic free layer 186 is upwardly vertical to the horizontal direction. A heater layer 188 is disposed on the perpendicular magnetic free layer 186. Referring to FIG. 6(b), the temperature of the perpendicular magnetic free layer 186 is raised to a predetermined high temperature by the heater layer 188, so as to change to the paramagnetic state. Referring to FIG. 6(c), a magnetic field H is applied at the high temperature, and the direction of the magnetic field H is reverse to the original magnetization of the perpendicular magnetic free layer 186. The paramagnetic state is likely to generate a magnetization in the same direction of the magnetic field H. Referring to FIG. 6(d), when the temperature is decreased to the room temperature, the magnetization of the perpendicular magnetic free layer 186 is changed to be downward. FIG. 6(a) and FIG. 6(d) show two memory states, which is capable of memorizing one-bit data.

However, as the magnetoresistance (MR) of the perpendicular MTJ element of such a design is too small, and the element is required to have a vertical field design, the density of the memory cannot be effectively improved. Therefore, at present, the MR value of the structure is required to be improved and the size of the structure is required to be reduced.

SUMMARY OF THE INVENTION

Accordingly, the present invention is directed to a magnetic material with thermal assistant for generating an interactive coupling force on a free layer to improve the thermal stability of the free layer and solve the problem of the interference caused by writing, thus expanding the wiring range. Thus, the size of magnetic tunnel junctions (MTJ) element can be reduced while maintaining high thermal stability, and thus the problem of the interference caused by writing is solved.

The present invention is directed to a magnetic memory cell structure with thermal assistant, including a magnetic pinned layer, a barrier layer, a magnetic free layer, a perpendicular magnetic layer, and a heating layer, sequentially stacked. The magnetic free layer has a longitudinal magnetization. The perpendicular magnetic layer has a perpendicular magnetization at a first temperature, which perpendicularly coupling to a longitudinal magnetization of the magnetic free layer. The perpendicular magnetic layer is in a paramagnetic state at a second temperature.

The present invention provides a magnetic random access memory, including a plurality of magnetic memory cells with thermal assistant for forming a memory array and a driving circuit for accessing the magnetic memory cells with thermal assistant. Each of the magnetic memory cells with thermal assistant includes a magnetic pinned layer disposed on the antiferromagnetic layer, a barrier layer disposed on the magnetic pinned layer, a magnetic free layer disposed on the barrier layer and including a longitudinal magnetization, a perpendicular magnetic layer disposed on the magnetic free layer. The perpendicular magnetic layer has a perpendicular magnetization at a first temperature, perpendicularly coupling to the longitudinal magnetization of the magnetic free layer. Further, the perpendicular magnetic layer is in a paramagnetic state at a second temperature, and a heating layer is disposed on the perpendicular magnetic layer.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
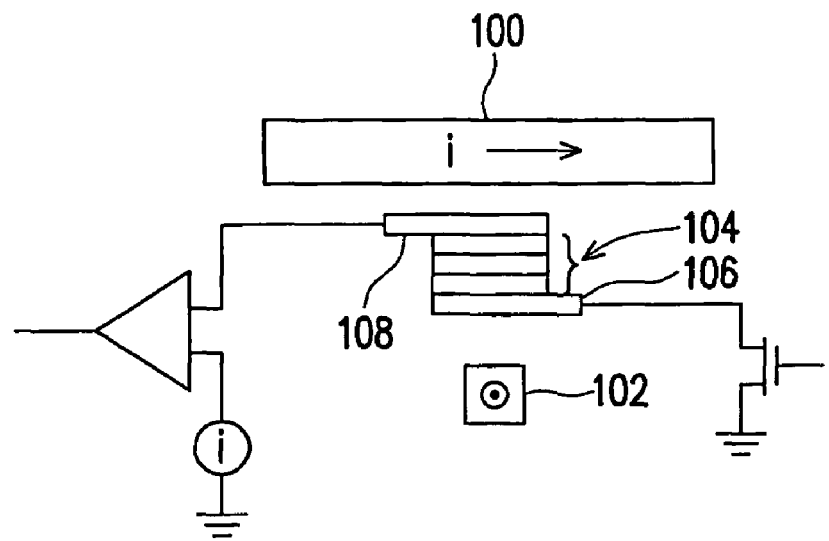
FIG. 1 shows a basic structure of a magnetic memory.
Figure 2:
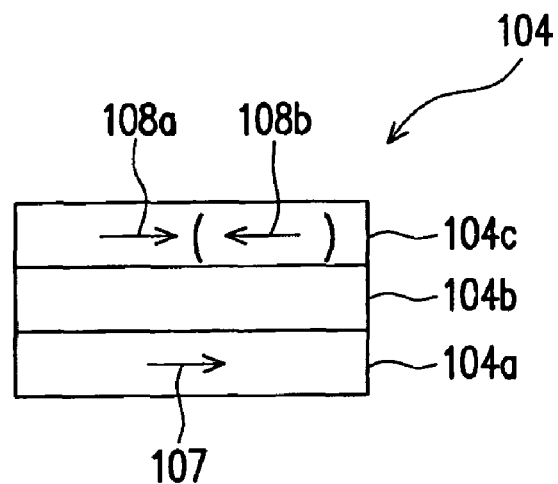
FIG. 2 shows a memory mechanism of a magnetic memory cell.

Reference will now be made in detail to the present embodiments of the invention, examples of which are illustrated in the accompanying drawings. Wherever possible, the same reference numbers are used in the drawings and the description to refer to the same or like parts.

The present invention adopts a magnetic material with thermal assistant to generate an interactive coupling force on a free layer to improve the thermal stability of the free layer. A perpendicular magnetic material having a magnetic property of being sensitive to the temperature and changing with temperature is selected. The magnetic field required when writing is reduced by a writing manner with thermal assistant, thus further reducing the current. The writing manner can effectively eliminate the problem of the interference generated when writing, thus improving the writing range. Therefore, the present invention can reduce the size of the magnetic tunnel junction (MTJ) element while maintaining high thermal stability, and thus the problem of interference caused by writing is solved.

Figure 3:
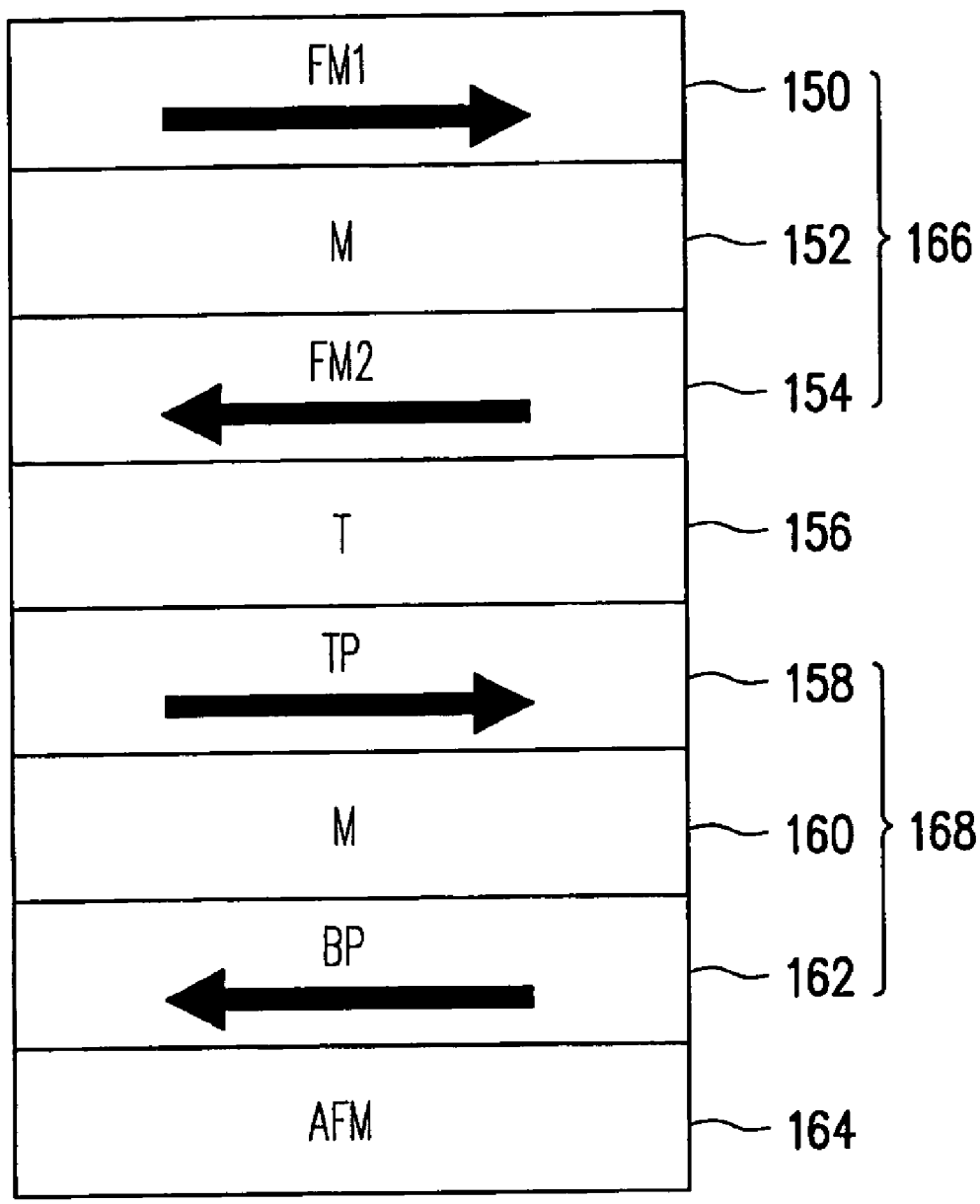
FIG. 3 shows a structure of a conventional synthetic antiferromagnetic free layer for toggle mode.
Figure 4A:
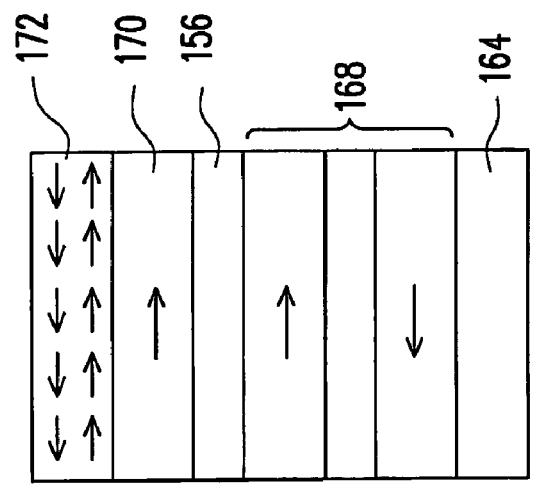
FIGS. 4A to 4C show a memory cell mechanism with thermal assistant using an antiferromagnetic layer to applying a bias field.
Figure 4B:
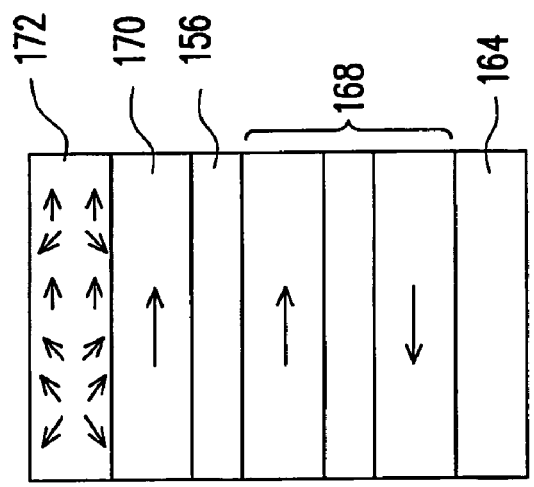
Figure 4C:
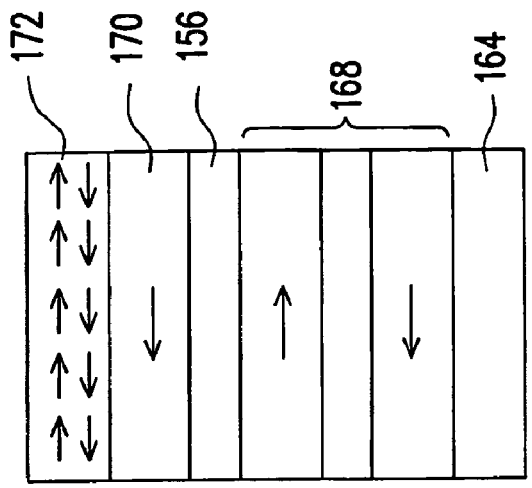
Figure 5B:
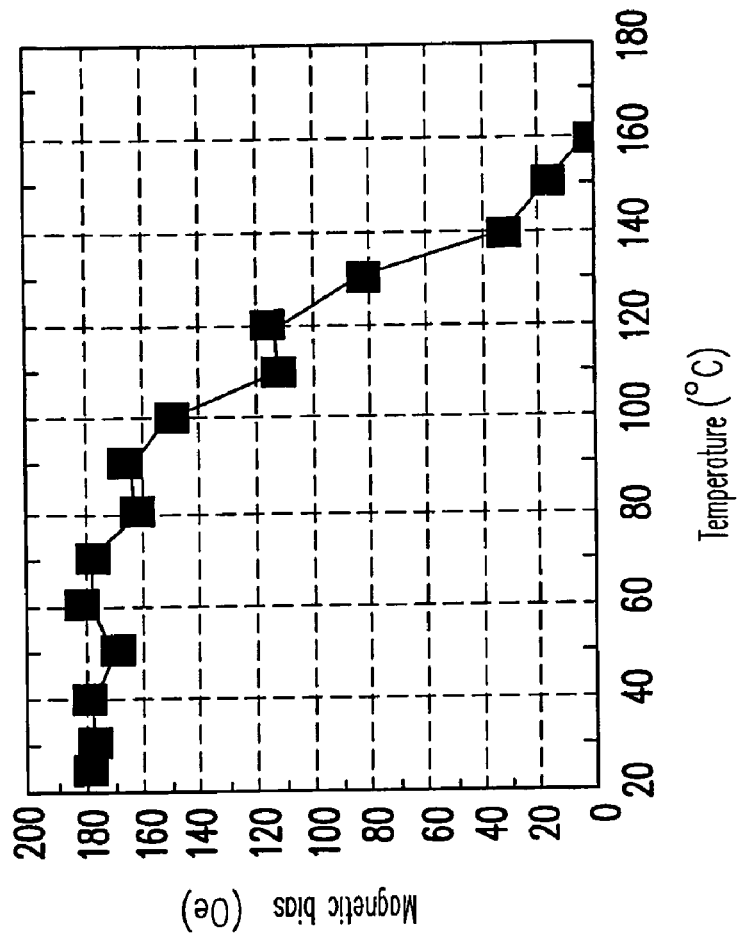
FIG. 5B is a schematic view of a relationship between an exchange magnetic bias strength and a temperature.
Figure 5A:
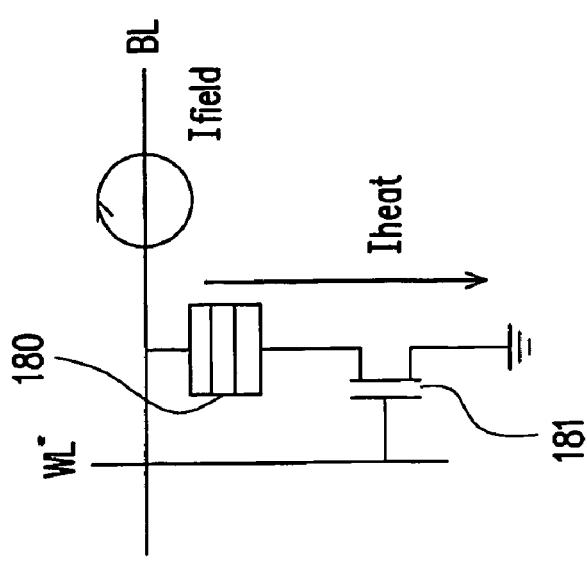
FIG. 5A is a schematic view of an operating circuit.
Figure 6:
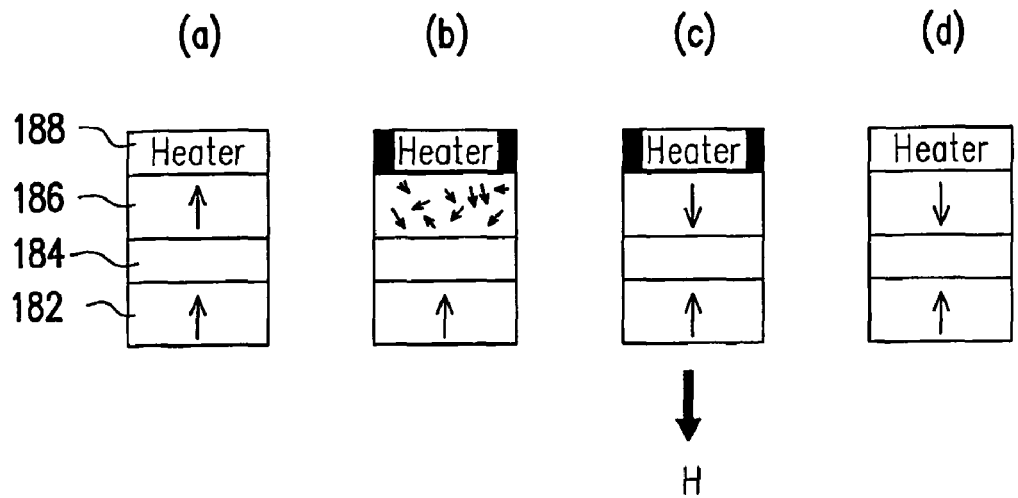
FIG. 6 shows a structure of another conventional memory cell with thermal assistant.
Figure 7:
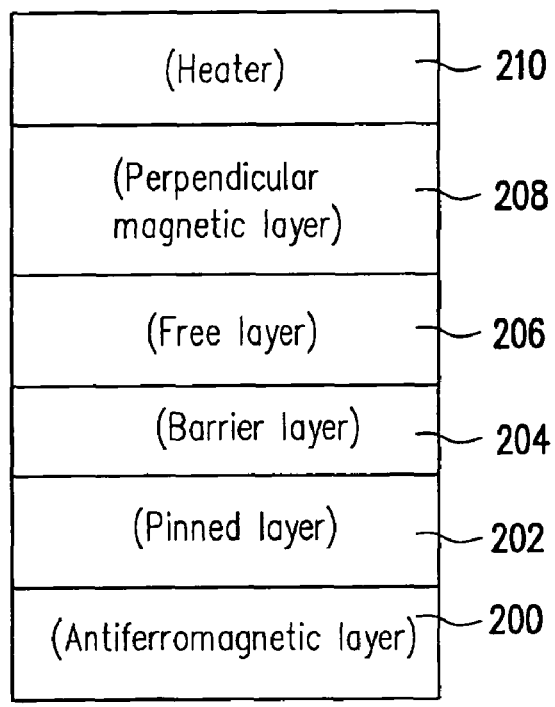
FIG. 7 is a schematic cross-sectional view of a magnetic memory cell structure with thermal assistant according to an embodiment of the present invention.

The following embodiments are used to illustrate, but not to limit the present invention. FIG. 7 is a schematic cross-sectional view of a magnetic memory cell structure with thermal assistant according to an embodiment of the present invention. Referring to FIG. 7, the magnetic memory cell structure with thermal assistant has an antiferromagnetic layer 200. A magnetic pinned layer 202 is disposed on the antiferromagnetic layer 200. The magnetic pinned layer 202 is, for example, the magnetic pinned stacked layer 168 in FIG. 3, and is a synthetic antiferromagnetic layer. Although the antiferromagnetic layer is a material having a total magnetization of zero, the interface will be coupling to the bottom pinned layer of the magnetic pinned layer 202 to generate a magnetic bias field, so as to further enhance the stability of the pinned layer and define the magnetization direction of the pinned layer. Definitely, the magnetic pinned layer 202 may also have a single-layered structure having a magnetization in a predetermined direction.

Furthermore, a magnetic free layer 206 is stacked on the magnetic pinned layer 202 by a barrier layer 204. The magnetic free layer 206 may have a single-layered or a composite structure, and may also be a synthetic antiferromagnetic layer in FIG. 3. Herein, the magnetization of the magnetic free layer 206 is the longitudinal magnetization.

Next, a perpendicular magnetic layer 208 is disposed on the magnetic free layer 206. The perpendicular magnetic layer 208 has a perpendicular magnetization at a first temperature, for example, the room temperature. The perpendicular magnetization is perpendicularly coupling to the longitudinal magnetization of the magnetic free layer 206. Furthermore, the perpendicular magnetic layer 208 is in a paramagnetic state at a second temperature, for example, the Curie temperature. The temperature is controlled by a heater layer 210, for example, disposed on the perpendicular magnetic layer 208, so as to change the operation temperature.

Figure 8:
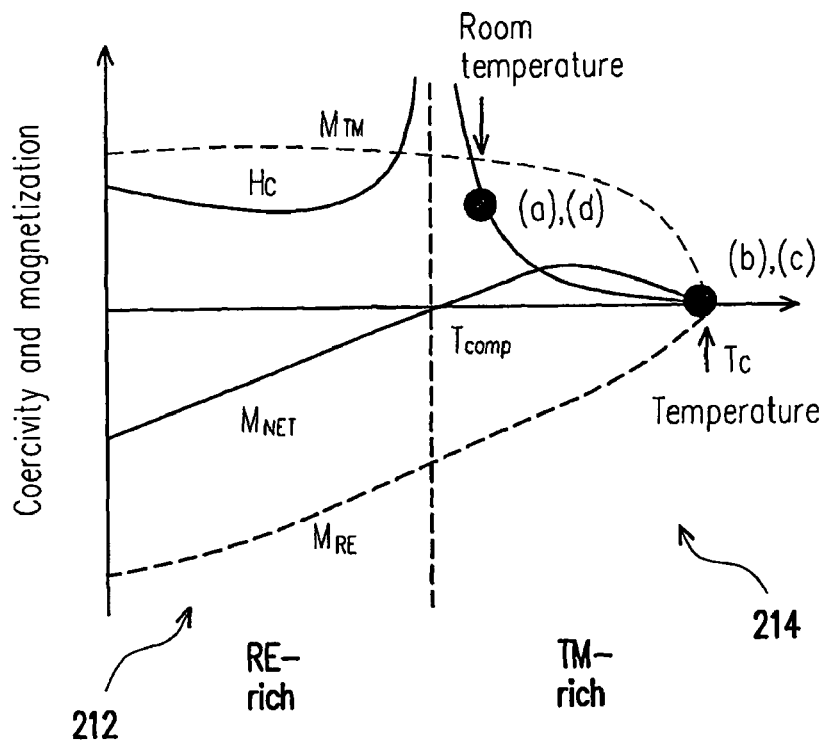
FIG. 8 is a schematic view of an operation mechanism according to an embodiment of the present invention.

The perpendicular magnetic material is formed by the appropriate formulation of the ingredients of rare-earth-transition-metal alloys according to the structure in FIG. 7. FIG. 8 is a schematic view of an operation mechanism according to an embodiment of the present invention. Referring to FIG. 8, the changes of a coercivity field along with the temperature are indicated by the Hc-curve, including a rare-earth-rich (RE-rich) area 212, in which the total magnetization is mainly dominated by rare-earth; and a transition-metal-rich (TM-rich) area 214, in which the total magnetization is mainly dominated by transition-metal. Furthermore, the changes of the magnetization $M_{TM}$ of transition-metal and the changes of the magnetization $M_{RE}$ of rare-earth element with temperature are indicated by the dashed lines. The net magnetization $M_{NET}$ generated by the magnetization $M_{TM}$ and the magnetization $M_{RE}$ are also changed with the temperature. As the directions of the two magnetizations are opposite to each other, the magnetization $M_{TM}$ and the magnetization $M_{RE}$ are counteracted to be zero at a temperature $T_{comp}$. Afterwards, at Currie temperature Tc, the net magnetization $M_{NET}$ reaches zero again, and at this time, the state is the paramagnetic state.

Figure 9:
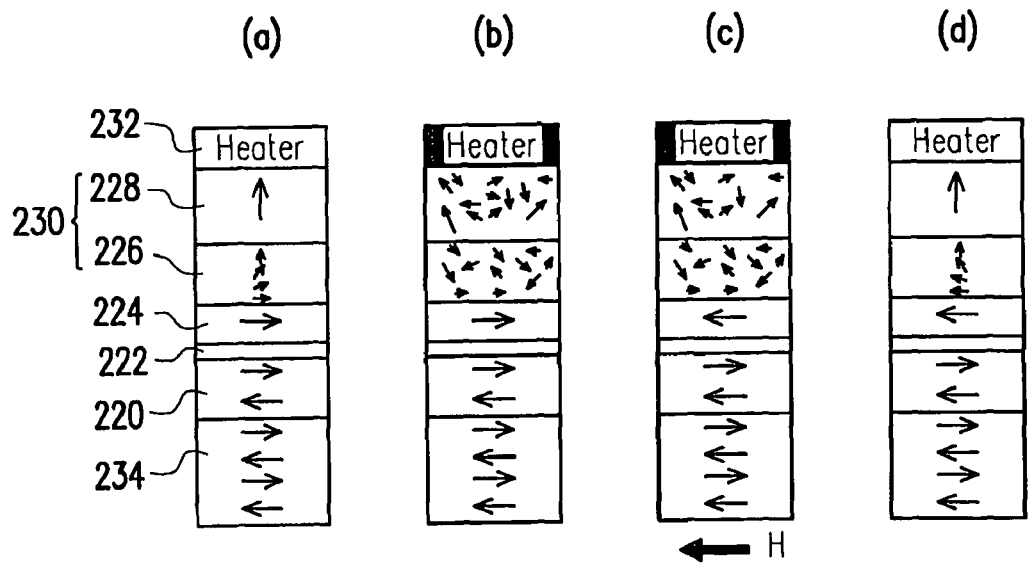
FIG. 9 is a schematic view of an operation mechanism of a perpendicular magnetic memory unit with thermal assistant according to an embodiment of the present invention.

According to the structure in FIG. 7 and the mechanism in FIG. 8, the structure of the perpendicular magnetic memory unit with thermal assistant according to the embodiment of the present invention has an additional perpendicular magnetic layer on the free layer of the original MTJ element. FIG. 9 is a schematic view of an operation mechanism of a magnetic memory unit with thermal assistant according to an embodiment of the present invention. Referring to FIG. 9(a), a magnetic pinned layer 220 is, for example, a synthetic antiferreomagnet stacked layer. A magnetic free layer 224 has, for example, a single-layer or a mutilayer structure and has a longitudinal magnetization. A barrier layer 222 is disposed between the magnetic pinned layer 220 and the magnetic free layer 224. Furthermore, an antiferromagnetic layer 234 may be disposed, for example, below the magnetic pinned layer 220 to make the magnetization of the magnetic pinned layer 220 more stable. The material of the antiferromagnetic layer 234 includes, for example, PtMn, IrMn, FeMn, or NiMn.

In this embodiment, the material of the perpendicular magnetic layer 230 is selected to have a perpendicular magnetization direction and magnetic property that is highly sensitive to the temperature. After research, the magnetic material having the two properties may be a ferrimagnetic material composed of rare-earth-transition-metal (RE-TM) alloys, and the ferrimagnetic material is for example, such as TbFeCo, TbCo, TbFe, GdFeCo, GdCo, GdFe. The relationship between the magnetic property of the material and the temperature is as shown in FIG. 8, and thus the values of $T_{comp}$ and $T_c$ may be controlled by adjusting the ingredients. The magnetic property of the RE-TM material is composed of two magnetizations, when the temperature changes, the temperature at which the two magnetizations are counteracted is defined as the compensation temperature ($T_{comp}$). When the temperature is continuously increased to the temperature at which the ferrimagnetic magnetic property is lost, this temperature at which the ferrimagnetic magnetic property is lost is defined as the Curie temperature ($T_c$). The present invention utilizes the relationship between the magnetic property and the temperature to reduce the writing current.

Further, the perpendicular magnetic layer 230 can further have, for example, a dual-layer structure, and includes a magnetic transfer layer 226 disposed on the magnetic free layer 224 and a magnetic coupling layer 228 disposed on the magnetic transfer layer 226 having a perpendicular magnetization which is coupling to the longitudinal magnetization of the magnetic free layer 224. The magnetic transfer layer 226 functions as, for example, an interface, and the magnetization distribution is rotated from the horizontal magnetization to the perpendicular magnetization. Furthermore, for example, the anisotropic energy of the magnetic transfer layer 226 is lower than that of the magnetic coupling layer 228.

The magnetizations of the magnetic free layer and perpendicular magnetic layer in FIG. 9(a) change, while the magnetizations of the pinned layers do not change in operation. In FIG. 9(a), a multi-layer perpendicular magnetic material is used to generate an interactive coupling force on the magnetic free layer. This force makes the free layer to be fixed in a specific direction, and thus the magnetic field required by the magnetic free layer for switching is increased, thereby achieving the purpose of improving the thermal stability. The RE-TM perpendicular magnetic material has a high anisotropic energy, indicating that the magnetic field required for switching the material will be relatively large. Indicated by point (a) in FIG. 8, the RE-TM perpendicular magnetic material has high Hc, so a good thermal stability is maintained when the size is small. In order to achieve an easy control of such an interactive coupling force, a multi-layer perpendicular magnetic material can be used, and a RE-TM material having lower anisotropic energy can be used near the interface. The material of the magnetic transfer layer 226 includes, for example, GdFeCo, GdFe, or GdCo. And then, the RE-TM having high anisotropic energy, for example, TbFeCo, TbFe, or TbCo, is used as the magnetic coupling layer 228 to improve the thermal stability.

Referring to FIG. 9(b), when writing, the temperature is raised to Tc above by a heater layer 232, for example to a temperature marked by point (b) in FIG. 8. At this time, the material of the perpendicular magnetic layer 230 is changed to be paramagnetic, that is, the magnetization is changed to be arranged in a disordered manner, and thus the interactive coupling force of the corresponding magnetic free layer disappears. At this time, the magnetic free layer 224 assumes the properties of the original magnetic material, for example, the properties of NiFe, CoFe, or CoFeB. The magnetization of the magnetic free layer 224 is used to memorize the binary data, which is determined by the direction of the magnetization. Referring to FIG. 9(c), in order to change the direction of the magnetization of the magnetic free layer 224, a magnetic field may be applied while heating. In such manner, the magnetic free layer 224 can be easily written into the desired direction of the magnetization. Next, referring to FIG. 9(d), the temperature is decreased after writing data, such that the material of the perpendicular magnetic layer 230 is returned to be ferrimagnetic, so as to generate an interactive coupling force on the magnetic free layer 224. The switching field assumes the high-Hc state, for example, the temperature marked by point (d) in FIG. 8. The magnetic transfer layer 226 can enhance the coupling of the longitudinal magnetization and the perpendicular magnetization, and thus the data in magnetic free layer 224 will not be easily disturbed at the room temperature, thereby having a high thermal stability. However, the magnetic transfer layer 226 is optional.

Furthermore, a memory array composed of a plurality of memory cells of the embodiments is utilized together with the driving circuit, so as to fabricate a high-capacity magnetic random access memory.

By means of coupling the perpendicular magnetization of the perpendicular magnetic layer 230 with the longitudinal magnetization of the magnetic free layer 224, the present invention maintains the data state between the magnetic free layer 224 and the magnetic pinned layer 220, and further maintains the thermal stability by perpendicularly applying the bias, and meanwhile reduces the operation current by heating. The size may be effectively reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A magnetic memory cell structure with thermal assistant, comprising:
    a magnetic pinned layer;
    a barrier layer, disposed on the magnetic pinned layer;
    a magnetic free layer, disposed on the barrier layer, comprising a longitudinal magnetization;
    a perpendicular magnetic layer, disposed on the magnetic free layer, comprising a perpendicular magnetization at a first temperature and perpendicularly coupling to the longitudinal magnetization of the magnetic free layer, wherein the perpendicular magnetic layer is in a paramagnetic state at a second temperature; and
    a heater layer, disposed on the perpendicular magnetic layer.

2. The magnetic memory cell structure with thermal assistant according to claim 1, wherein the perpendicular magnetic layer comprises a single-layered structure or a stacked structure.

3. The magnetic memory cell structure with thermal assistant according to claim 1, wherein the perpendicular magnetic layer comprises a magnetic material layer containing a rare-earth-transition-metal alloys.

4. The magnetic memory cell structure with thermal assistant according to claim 1, wherein the perpendicular magnetic layer comprise a material of TbFeCo, TbCo, TbFe, GdFeCo, GdCo, GdFe, DyFe, DyCo or DyFeCo.

5. The magnetic memory cell structure with thermal assistant according to claim 1, wherein a material of the magnetic free layer comprises Co, NiFe, CoFe, CoFeB or CoFeNi.

6. The magnetic memory cell structure with thermal assistant according to claim 1, wherein the perpendicular magnetic layer comprises:
    a magnetic transfer layer; and
    a magnetic coupling layer, comprising the perpendicular magnetization coupling to the longitudinal magnetization of the magnetic free layer, wherein a magnetization distribution of the magnetic transfer layer is changed from the longitudinal magnetization to the perpendicular magnetization.

7. The magnetic memory cell structure with thermal assistant according to claim 1, wherein the perpendicular magnetic layer comprises:
    a magnetic coupling layer, disposed on the free layer, and comprising the perpendicular magnetization coupling to the longitudinal magnetization of the magnetic free layer.

8. The magnetic memory cell structure with thermal assistant according to claim 6, wherein an anisotropic energy of the magnetic transfer layer is lower than that of the magnetic coupling layer.

9. The magnetic memory cell structure with thermal assistant according to claim 6, wherein a material of the magnetic transfer layer comprises GdFeCo, GdCo or GdFe, and a material of the magnetic coupling layer comprises TbFeCo, TbCo or TbFe.

10. The magnetic memory cell structure with thermal assistant according to claim 1, further comprising an antiferromagnetic layer, wherein the magnetic pinned layer disposed on an antiferromagnetic layer.

11. The magnetic memory cell structure with thermal assistant according to claim 10, wherein a material of the antiferromagnetic layer comprises PtMn, IrMn, FeMn or NiMn.

12. The magnetic memory cell structure with thermal assistant according to claim 1, wherein the magnetic free layer is of a stacked structure and comprises a pair of antiparallel magnetizations or parallel magnetizations.

13. The magnetic memory cell structure with thermal assistant according to claim 1, wherein the magnetic pinned layer is of a stacked structure and comprises a pair of antiparallel magnetizations remaining unchanged under an external operation magnetic field.

14. The magnetic memory cell structure with thermal assistant according to claim 1, wherein the first temperature is a room temperature, and the second temperature is a Curie temperature.

15. A magnetic random access memory, comprising:
   a plurality of magnetic memory cells with thermal assistant, forming a memory array; and
   a driving circuit, for accessing the magnetic memory cells with thermal assistant,
   wherein each of the magnetic memory cells with thermal assistant comprises:
      a magnetic pinned layer, disposed on an antiferromagnetic layer;
      a barrier layer, disposed on the magnetic pinned layer;
      a magnetic free layer, disposed on the barrier layer, comprising a longitudinal magnetization;
      a perpendicular magnetic layer, disposed on the magnetic free layer, comprising a perpendicular magnetization at a first temperature, perpendicularly coupling to the longitudinal magnetization of the magnetic free layer, wherein the perpendicular magnetic layer is in a paramagnetic state at a second temperature; and
      a heater layer, on the perpendicular magnetic layer.

16. The magnetic random access memory according to claim 15, wherein the perpendicular magnetic layer comprises a single-layered structure or a stacked structure.

17. The magnetic random access memory according to claim 15, wherein the perpendicular magnetic layer comprises a magnetic material layer containing a rare-earth-transition-metal alloys.

18. The magnetic random access memory according to claim 15, wherein the perpendicular magnetic layer comprises a material of TbFeCo, TbCo, TbFe, GdFeCo, GdCo, GdFe, DyFe, DyCo or DyFeCo.

19. The magnetic random access memory according to claim 15, wherein a material of the magnetic free layer comprises Co, NiFe, CoFe, CoFeB or CoFeNi.

20. The magnetic random access memory according to claim 15, wherein the perpendicular magnetic layer comprises:
   a magnetic transfer layer, disposed on the free layer; and
   a magnetic coupling layer, comprising the perpendicular magnetization coupling to the longitudinal magnetization of the magnetic free layer, wherein a magnetization distribution of the magnetic transfer layer is changed from the longitudinal magnetization to the perpendicular magnetization.

21. The magnetic random access memory according to claim 15, wherein the perpendicular magnetic layer comprises:
   a magnetic coupling layer, disposed on the free layer, and comprising the perpendicular magnetization coupling to the longitudinal magnetization of the magnetic free layer.

22. The magnetic random access memory according to claim 20, wherein an anisotropic energy of the magnetic transfer layer is lower than that of the magnetic coupling layer.

23. The magnetic random access memory according to claim 20, wherein a material of the magnetic transfer layer comprises GdFeCo, GdCo, or GdFe, and a material of the magnetic coupling layer comprises TbFeCo, TbCo, or TbFe.

24. The magnetic random access memory according to claim 15, further comprising an antiferromagnetic layer, wherein the magnetic pinned layer disposed on an antiferromagnetic layer.

25. The magnetic random access memory according to claim 24, wherein a material of the antiferromagnetic layer comprises PtMn, IrMn, FeMn or NiMn.

26. The magnetic random access memory according to claim 15, wherein the first temperature is a room temperature, and the second temperature is a Curie temperature.

* * * * *

UNITED STATES PATENT AND TRADEMARK OFFICE
CERTIFICATE OF CORRECTION

| | | |
|---|---|---|
| PATENT NO. | : 7,852,664 B2 | Page 1 of 1 |
| APPLICATION NO. | : 12/189781 | |
| DATED | : December 14, 2010 | |
| INVENTOR(S) | : Chen | |

It is certified that error appears in the above-identified patent and that said Letters Patent is hereby corrected as shown below:

On the cover page of the patent grant, please replace item (54) with:

(54) MAGNETIC MEMORY CELL STRUCTURE WITH THERMAL ASSISTANT AND MAGNETIC RANDOM ACCESS MEMORY

Signed and Sealed this
Twenty-sixth Day of April, 2011

David J. Kappos
*Director of the United States Patent and Trademark Office*

UNITED STATES PATENT AND TRADEMARK OFFICE
CERTIFICATE OF CORRECTION

PATENT NO. : 7,852,664 B2  Page 1 of 1
APPLICATION NO. : 12/189781
DATED : December 14, 2010
INVENTOR(S) : Chen It is certified that error appears in the above-identified patent and that said Letters Patent is hereby corrected as shown below:

On the cover page of the patent grant, Item (54) and at Column 1, lines 1-4, please replace title with:

MAGNETIC MEMORY CELL STRUCTURE WITH THERMAL ASSISTANT AND MAGNETIC RANDOM ACCESS MEMORY

This certificate supersedes the Certificate of Correction issued April 26, 2011.

Signed and Sealed this
Twenty-fourth Day of May, 2011

David J. Kappos
*Director of the United States Patent and Trademark Office*